US010873294B2

(12) United States Patent
Deak et al.

(10) Patent No.: US 10,873,294 B2
(45) Date of Patent: Dec. 22, 2020

(54) BALANCED MAGNETORESISTIVE FREQUENCY MIXER

(71) Applicant: MultiDimension Technology Co., Ltd., Zhangjiagang (CN)

(72) Inventors: James Geza Deak, Zhangjiagang (CN); Zhimin Zhou, Zhangjiagang (CN)

(73) Assignee: MultiDimension Technology Co., Ltd., Zhangjiagang (CN)

( * ) Notice: Subject to any disclaimer, the term of this patent is extended or adjusted under 35 U.S.C. 154(b) by 19 days.

(21) Appl. No.: 16/326,342

(22) PCT Filed: Aug. 17, 2017

(86) PCT No.: PCT/CN2017/097933
§ 371 (c)(1),
(2) Date: May 13, 2019

(87) PCT Pub. No.: WO2018/033125
PCT Pub. Date: Feb. 22, 2018

(65) Prior Publication Data
US 2019/0280650 A1  Sep. 12, 2019

(30) Foreign Application Priority Data
Aug. 18, 2016  (CN) .......................... 2016 1 0685029

(51) Int. Cl.
*H03D 7/14* (2006.01)
*G01R 33/00* (2006.01)
*G01R 33/09* (2006.01)

(52) U.S. Cl.
CPC ............ *H03D 7/14* (2013.01); *G01R 33/0094* (2013.01); *G01R 33/09* (2013.01); *G01R 33/091* (2013.01); *G01R 33/098* (2013.01)

(58) Field of Classification Search
None
See application file for complete search history.

(56) References Cited

U.S. PATENT DOCUMENTS 6,972,658 B1  12/2005  Findley et al.
2003/0057938 A1*  3/2003  Goetz ................... G01R 33/09
                                                                    324/117 R
(Continued)

FOREIGN PATENT DOCUMENTS

CN  102914749  2/2013
CN  103384141  11/2013
(Continued)

OTHER PUBLICATIONS

"International Application No. PCT/CN2017/097933, International Search Report and Written Opinion dated Oct. 26, 2017", (Oct. 26, 2017), 10 pgs.

*Primary Examiner* — Paresh Patel
(74) *Attorney, Agent, or Firm* — Schwegman Lundberg & Woessner, P.A.

(57) ABSTRACT

A balanced magnetoresistive frequency mixer comprises a first spiral coil, a second spiral coil, a balanced magnetoresistive sensor bridge, and a magnetic shielding layer. The coils are located between the magnetic shielding layer and the sensor bridge. The sensor bridge comprises a magnetoresistive full bridge consisting of four bridge arms and a balancing bridge arm connected to the power supply end of the full bridge. The four bridge arms contain pairs located in a first sub region and a second sub region above or below the first spiral coil, the balancing arm is located in a third sub region above or below the second spiral coil, a first frequency signal is input into the first spiral coil, a second frequency signal is input into the second spiral coil, and a frequency-mixed signal is output from a signal output end of the full bridge.

10 Claims, 12 Drawing Sheets

(56) References Cited

U.S. PATENT DOCUMENTS

2016/0164463 A1 6/2016 Zhou et al.
2020/0217908 A1* 7/2020 Deak .................... G01R 33/093

FOREIGN PATENT DOCUMENTS

| CN | 203482163 | 3/2014 |
| CN | 106160670 A | 11/2016 |
| CN | 206077338 U | 4/2017 |
| WO | WO-2018033125 A1 | 2/2018 |

* cited by examiner

BALANCED MAGNETORESISTIVE FREQUENCY MIXER

PRIORITY CLAIM TO RELATED APPLICATIONS

This application is a U.S. national stage filing under 35 U.S.C. § 371 from International Application No. PCT/CN2017/097933, filed on 17 Aug. 2017, and published as WO2018/033125 on 22 Feb. 2018, which claims the benefit under 35 U.S.C. 119 to Chinese Application No. 201610685029.7, filed on 18 Aug. 2016, the benefit of priority of each of which is claimed herein, and which applications and publication are hereby incorporated herein by reference in their entirety.

TECHNICAL FIELD

The present invention relates to the field of magnetic sensor technologies, and in particular, to a balanced magnetoresistive frequency mixer.

BACKGROUND ART

A frequency mixer is an electronic device for converting a signal of a frequency f1 and a signal of a frequency f2 into output signals of characteristic frequencies f1+f2 and f1−f2. By using the frequency mixer, the signal frequency is shifted to a high-frequency or low-frequency position, thus facilitating signal processing. For example, the signal frequency is shifted by using a frequency mixing technology to separate a noise signal, then noise can be filtered by using a filtering technology, and the signal frequency is recovered to the original value by using the frequency mixing technology, thus achieving processing on the noise signal. Therefore, the frequency mixing technology has been widely applied in signal processing circuit technologies.

Frequency mixers used currently include two types: passive frequency mixers and active frequency mixers. A passive frequency mixer adopts one or more diodes and uses an approximate quadratic characteristic of a non-linear section of a current-voltage characteristic curve of the diode to implement multiplication. Operation is as follows. Two input signals are applied to the diode, the resulting output current signal of the diode is converted into a voltage signal representing the output product of the two input signals.

An active frequency mixer increases the intensity of a product signal by using a multiplier (e.g., a transistor or a vacuum tube) and mixes an input frequency signal with a local oscillator frequency, and thus a signal output frequency including addition and subtraction of two frequencies can be obtained. The active frequency mixer increases an isolation degree of two input ends, however, there may be more noise and higher power consumption.

The foregoing frequency mixers have the following problems:

1) The diode frequency mixer uses an approximate process method. In addition to a required frequency, there are also other unwanted frequency harmonics with significant power in the output signal strength. Therefore, noise needs to be separated by using technologies such as a filter subsequently before the required signal is obtained.

2) The active frequency mixer uses a local oscillator to implement frequency mixing, and an output signal including various types of other frequencies also needs to be separated by using a filter. Moreover, devices such as a multiplier and a local oscillator increase the complexity and power consumption of the circuit.

3) The input signal and the output signal cannot be effectively isolated, and thus they will affect each other.

A magnetoresistive frequency mixer is proposed in Chinese Patent No. 201310313538.3 to solve the above problems. By using the characteristic that a magnetoresistive sensor has a good linear relationship as an external magnetic field changes, one frequency signal is converted into a magnetic field signal which is generated by a current flowing through a coil, and the other frequency signal is converted into a power supply signal which is applied to the magnetoresistive sensor. Therefore, an output signal of the magnetoresistive sensor is a multiplication operation signal of the two frequencies, and the obtained frequency is a sum and a difference thereof. No other redundant signals exist, and therefore, other elements such as a filter are not required. The coil and the sensor are coupled by a magnetic field, thus achieving effective isolation between the input signals and between the input signal and the output signal.

However, the above magnetoresistive frequency mixer has the following problem. In addition to serving as signals of the frequency mixer, the first frequency signal and the second frequency signal also serve as power supply signals of the magnetoresistive sensor. Generally, the amplitude of the power supply signal is higher than that of the signal, thus affecting the selection by the frequency mixer for the second frequency signal.

SUMMARY OF THE INVENTION

In order to solve the above problems, a balanced magnetoresistive frequency mixer is provided in the present invention, in which a first frequency signal and a second frequency signal are both applied to a magnetoresistive arm through spiral coils to implement frequency mixing, and at the same time, a voltage source is individually stable, thus avoiding the problem caused by serving as a power supply and a signal simultaneously.

The present invention is implemented according to the following technical solutions.

A balanced magnetoresistive frequency mixer according to the present invention comprises a spiral coil, a balanced magnetoresistive sensor bridge, and a magnetic shielding layer. The spiral coil is located between the magnetic shielding layer and the balanced magnetoresistive sensor bridge. The spiral coil includes a first spiral coil and a second spiral coil. An upper surface or a lower surface of the first spiral coil has a first sub region and a second sub region, in which the current flows in opposite directions. An upper surface or a lower surface of the second spiral coil has a third sub region, in which the current flows in one direction. The balanced magnetoresistive sensor bridge includes a magnetoresistive full bridge and a balancing magnetoresistive arm connected to the magnetoresistive full bridge. The magnetoresistive full bridge consists of four magnetoresistive bridge arms, two of which are located in the first sub region and the other two are located in the second sub region. The balancing magnetoresistive arm is located in the third sub region. A first frequency signal is input into the first spiral coil, a second frequency signal is input into the second spiral coil, and a frequency-mixed signal is output from a signal output end of the magnetoresistive full bridge. The output frequency of the frequency-mixed signal is a sum of or a difference between the frequencies of the first frequency signal and the second frequency signal.

Further, there is one balancing magnetoresistive arm that is connected to a power supply output end or an input end of the magnetoresistive full bridge; or there are two balancing magnetoresistive arms that are connected to a power supply output end and an input end of the magnetoresistive full bridge, respectively.

Further, the magnetoresistive bridge arms and the balancing magnetoresistive arm separately include M*N arrayed magnetic tunnel junctions, the magnetic tunnel junctions in each column are connected in series to form a magnetic tunnel junction cell string, the magnetic tunnel junction cell strings are connected in series, in parallel, or in a series/parallel manner to form a two-port structure, N denotes a column of an arrayed structure, M denotes a row of the arrayed structure, and N and M are respectively positive integers greater than or equal to 1.

Further, sensitive axes of the magnetic tunnel junctions in the magnetoresistive bridge arms are all perpendicular to a current direction of the first spiral coil, sensitive axes of the magnetic tunnel junctions in the balancing magnetoresistive arm are all perpendicular to a current direction of the second spiral coil, and distribution characteristics of sensitive axial magnetic fields of the magnetic tunnel junctions in the first sub region are opposite to those of the magnetic tunnel junctions in the second sub region.

Further, the magnetic tunnel junctions in the first sub region and the magnetic tunnel junctions in the second sub region are connected in identical structures and arranged symmetrically.

Further, resistances of the magnetic tunnel junctions in the first sub region and the second sub region are respectively linear to sensitive axial magnetic fields of the magnetic tunnel junctions generated by the first spiral coil; and resistances of the magnetic tunnel junctions in the third sub region are linear to sensitive axial magnetic fields of the magnetic tunnel junctions generated by the second spiral coil.

Further, the magnetic tunnel junctions in the first sub region and the second sub region are perpendicular or parallel to the current direction of the first spiral coil, and the magnetic tunnel junctions in the third sub region are perpendicular or parallel to the current direction of the second spiral coil.

Further, the first frequency signal is connected to the first spiral coil actively or passively, the second frequency signal is connected to the second spiral coil passively or actively, and the frequency-mixed signal is connected to the signal output end of the balanced magnetoresistive sensor bridge passively or actively.

Further, the spiral coil is a coil of a high-conductivity metal material including one or more of copper, gold, silver, aluminum, and tantalum, and the magnetic shielding layer is a layer of a high-permeability ferromagnetic alloy including one or more of NiFe, CoFeSiB, CoZrNb, CoFeB, FeSiB, and FeSiBNbCu.

Further, the thickness of the spiral coil is 1-20 μm, the width of the spiral coil is 5-40 μm, a spacing between two adjacent spiral coils is 10-100 μm, and the thickness of the magnetic shielding layer is 1-20 μm.

In the balanced magnetoresistive frequency mixer according to the present invention, the first frequency signal is still applied to the four magnetoresistive bridge arms of the magnetoresistive bridge through the first coil, the second frequency signal is applied to the balancing magnetoresistive arm serially connected to the magnetoresistive bridge through the second coil, and two ends of the balanced magnetoresistive sensor bridge consisting of the four magnetoresistive bridge arms and the balancing magnetoresistive arm are directly connected to the power supply and the ground. During operation of the frequency mixer, the voltage between the power supply and the ground is unchanged, and the voltage at the two ends of the magnetoresistive full bridge consisting of the four magnetoresistive bridge arms is adjusted through the balancing magnetoresistive arm, thus mixing the frequencies of the first frequency signal and the second frequency signal as well. This method has an advantage that the first frequency signal and the second frequency signal are both applied to the magnetoresistive arms (the magnetoresistive bridge arms and the balancing magnetoresistive arm) through the spiral coils to implement frequency mixing, and at the same time, the voltage source is individually stable, thus avoiding the problem caused by serving as a power supply and a signal simultaneously.

Figure 1:
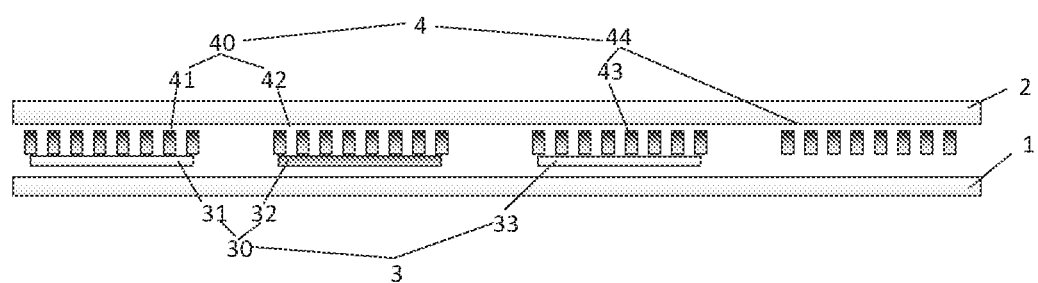
FIG. 1 is a sectional diagram of a balanced magnetoresistive frequency mixer according to the present invention.

In the drawings, 1—substrate, 2—magnetic shielding layer, 3—balanced magnetoresistive sensor bridge, 4—spiral coil, 40—first spiral coil, 44—second spiral coil, 41—first sub region. 42—second sub region, 43—third sub region, 31 and 32—magnetoresistive bridge arms, 33—balancing magnetoresistive arm.

DETAILED DESCRIPTION

In order to make objectives, technical solutions, and advantages of embodiments of the present invention clearer, the technical solutions in the embodiments of the present invention will be described below clearly and completely with reference to the accompanying drawings in the embodiments of the present invention. It is apparent that the described embodiments are some of rather than all the embodiments of the present invention.

Embodiment 1

FIG. 1 is a sectional structural diagram of a balanced magnetoresistive frequency mixer according to the present invention. The frequency mixer includes a spiral coil 4, a balanced magnetoresistive sensor bridge 3, and a magnetic shielding layer 2. The spiral coil 4 is located between the magnetic shielding layer 2 and the balanced magnetoresistive sensor bridge 3. The spiral coil 4 on a substrate 1 includes a first spiral coil 40 and a second spiral coil 44. The first spiral coil 40 includes a first sub region 41 and a second sub region 42 in which the current flows in opposite directions. The second spiral coil 44 includes a third sub region 43 in which the current flows in one direction. The balanced magnetoresistive sensor bridge 3 includes a magnetoresistive full bridge and a balancing magnetoresistive arm. The balancing magnetoresistive arm is connected to the magnetoresistive full bridge. The magnetoresistive full bridge consists of four magnetoresistive bridge arms, wherein two magnetoresistive bridge arms are located in the first sub region 41, and the other two magnetoresistive bridge arms are located in the second sub region 42. The balancing magnetoresistive arm is located in the third sub region 43. A first frequency signal is input into the first spiral coil 40, a second frequency signal is input into the second spiral coil 44, and a frequency-mixed signal is output from a signal output end of the magnetoresistive full bridge. The output frequency of the frequency-mixed signal is a sum of or a difference between the frequencies of the first frequency signal and the second frequency signal.

Figure 2:
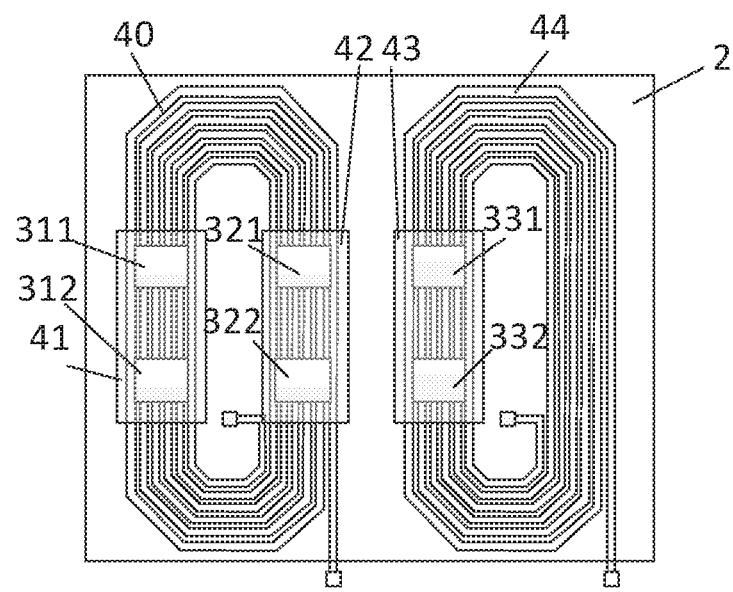
FIG. 2 is a top view of a balanced magnetoresistive frequency mixer according to the present invention.

FIG. 2 is a top view of a balanced magnetoresistive frequency mixer, wherein 2 denotes a magnetic shielding layer, 40 and 44 respectively denote a first spiral coil and a second spiral coil, and 41 and 42 respectively denote a first sub region 41 and a second sub region 42, in the first spiral coil 40, having leads arranged in parallel, in which the current flows in opposite directions. As such, distribution characteristics of magnetic fields generated by the first spiral coil 40 in the first sub region 41 and the second sub region 42 are in opposite directions, and it is ensured that the magnetoresistive bridge arm 31 and the magnetoresistive bridge arm 32 sense the same magnetic field under the same spiral coil current, such that the magnetoresistances of the magnetoresistive bridge arm 31 and the magnetoresistive bridge arm 32 have the same value and opposite directions. Likewise, the second spiral coil 44 also includes a section of third sub region 43 having leads arranged in parallel, and one or two balancing magnetoresistive arms 33 are located in the third sub region 43 in which the current flows in one direction.

Figure 3:
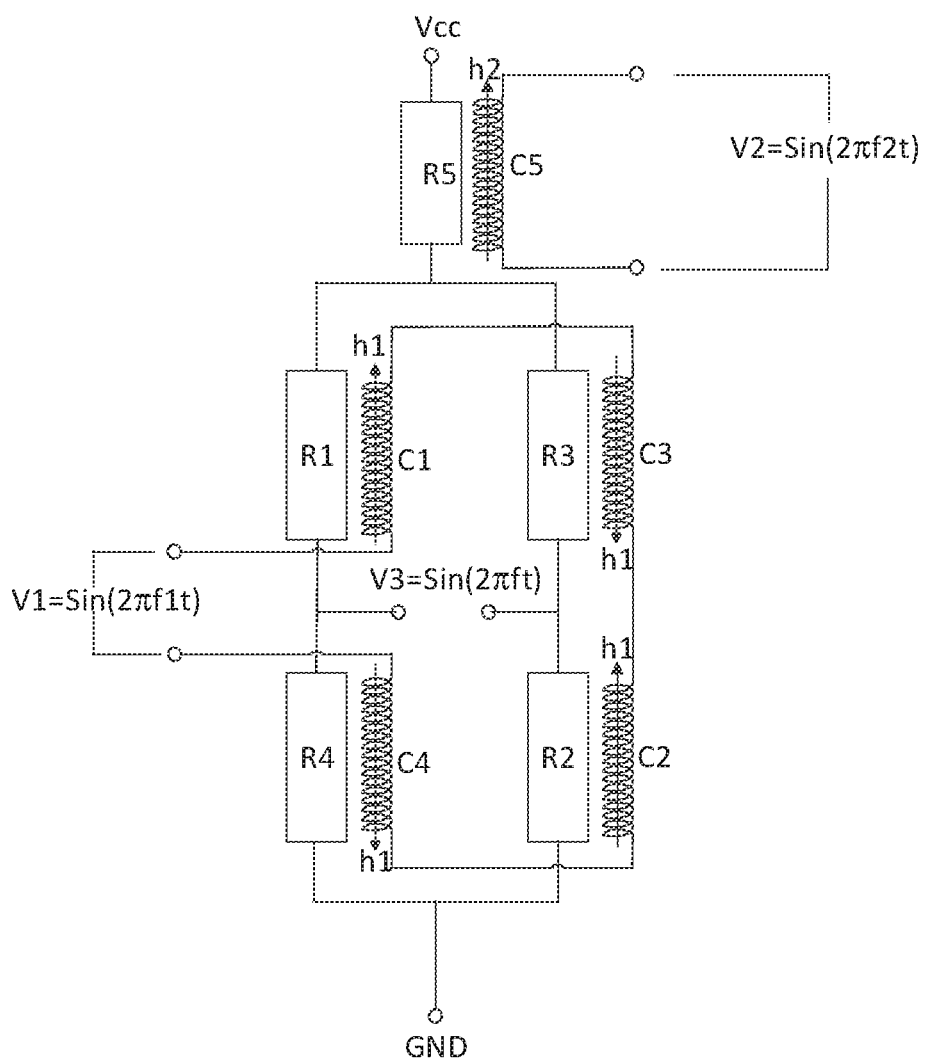
FIG. 3 is a schematic structural diagram of a balanced magnetoresistive frequency mixer according to the present invention.
Figure 4:
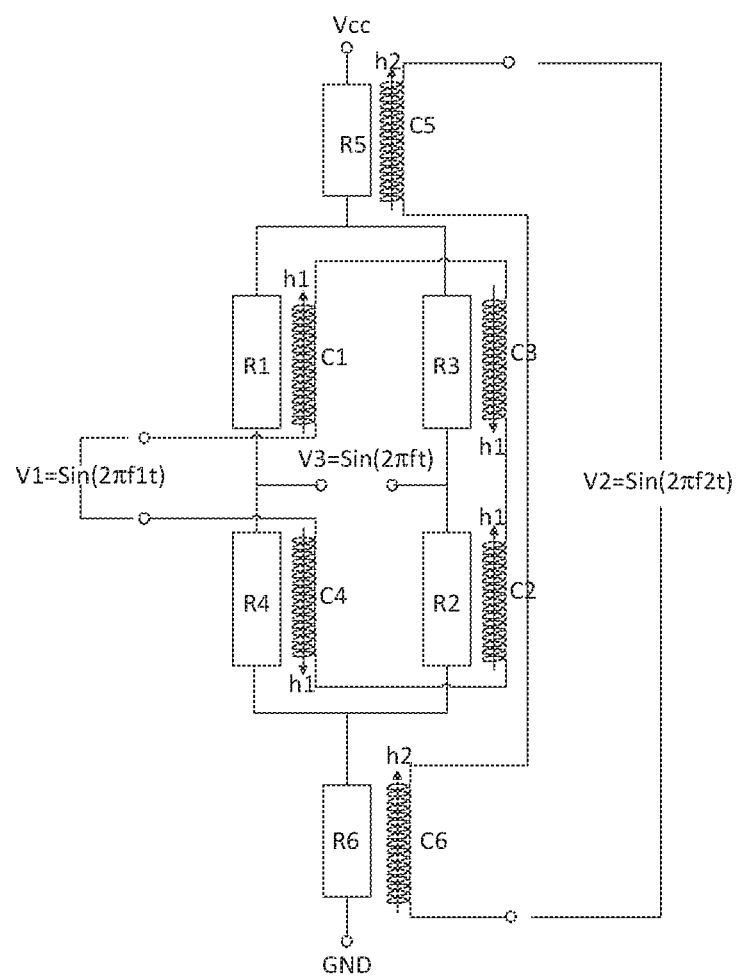
FIG. 4 is another schematic structural diagram of a balanced magnetoresistive frequency mixer according to the present invention.

FIG. 3 and FIG. 4 are two structural diagrams of a balanced bridge-type frequency mixer respectively. A balanced magnetoresistive sensor bridge includes a magnetoresistive full bridge and a balancing magnetoresistive arm. The magnetoresistive full bridge consists of four magnetoresistive bridge arms R1, R2, R3 and R4. There is one balancing magnetoresistive arm R5 which is located at a power supply input end or a current input end of the magnetoresistive full bridge and serially connected to the magnetoresistive full bridge. Alternatively, there are two balancing magnetoresistive arms R5 and R6 that are serially connected to a power supply output end and an input end of the magnetoresistive full bridge respectively. C1, C2, C3 and C4 form a first spiral coil, C5 and C6 form a second spiral coil, R1 and R2 are located in the first sub region, R3 and R4 are located in the second sub region, and R5 and R6 are located in the third sub region. The frequency of a voltage signal at two ends of a first frequency signal is f1, the signal frequency of the second frequency signal is f2, voltage sources at two ends of the balanced magnetoresistive sensor bridge are constant, being Vcc and GND respectively, and the frequency of a third signal output differentially from the signal output end is f.

Figure 5:
FIG. 5 is a magnetic field distribution diagram of a spiral coil in a balanced magnetoresistive frequency mixer according to the present invention on magnetoresistance.
Figure 6:
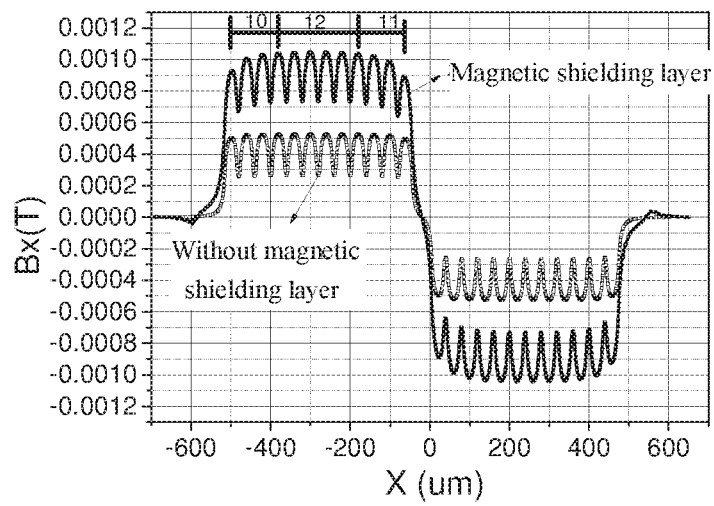
FIG. 6 is a magnetic field distribution diagram of a spiral coil with or without a magnetic shielding layer according to the present invention.

FIG. 5 is a spatial distribution curve diagram of a magnetic field generated by the first spiral coil or second spiral coil and the magnetic shielding layer. FIG. 6 is a diagram comparing the distribution of magnetic field components perpendicular to the current direction in a first sub region, second sub region or third sub region of the magnetoresistive sensor bridge on the upper surface or lower surface of the first spiral coil or second spiral coil with or without a magnetic shielding layer. As can be seen, the magnetic field strength is enhanced significantly after the magnetic shielding layer is applied. Moreover, the magnetic field has antisymmetric distribution characteristics in the first sub region and the second sub region. The magnetic field is distributed non-uniformly near a symmetric center 12 of the first sub region, second sub region or third sub region and marginal regions 10 and 11, while it is distributed uniformly in a middle region 12.

Figure 7:
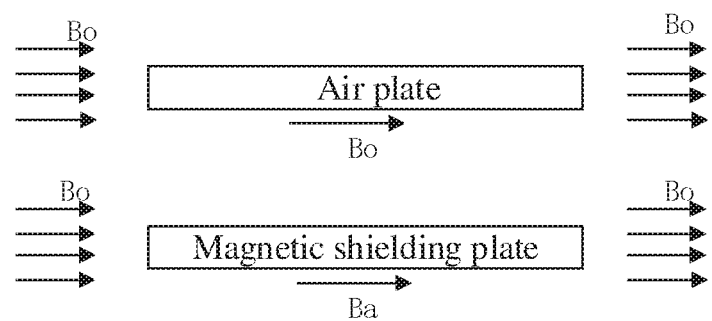
FIG. 7 is a calculation diagram of an attenuation factor of a magnetic shielding layer vs. an external magnetic field according to the present invention.
Figure 8:
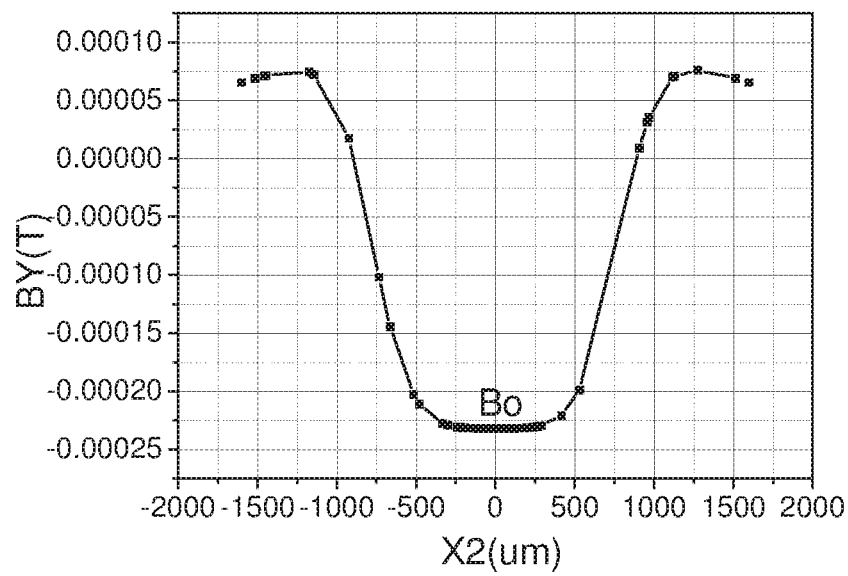
FIG. 8 is a distribution diagram of an external magnetic field without a magnetic shielding layer according to the present invention.
Figure 9:
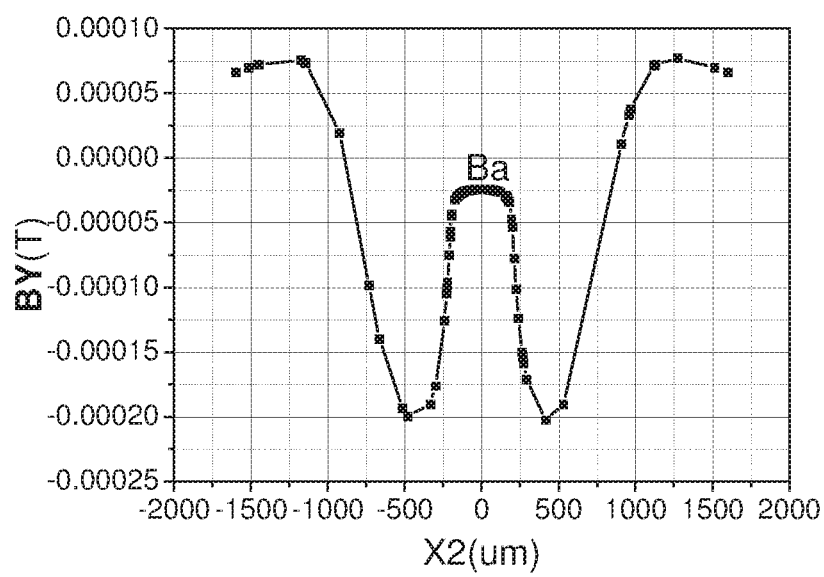
FIG. 9 is a distribution diagram of an external magnetic field with a magnetic shielding layer according to the present invention.

FIG. 7 is a calculation model of an attenuation rate of a magnetic shielding layer vs. an external magnetic field parallel to a plane. FIG. 8 is a distribution diagram of a magnetic field generated by a spiral coil at the position of a balanced magnetoresistive sensor bridge when no magnetic shielding layer exists, and FIG. 9 is a distribution diagram of a magnetic field generated by a spiral coil at the position of a balanced magnetoresistive sensor bridge when a magnetic shielding layer exists. As can be seen, the attenuation rate of the magnetic field is 1/9, indicating that the magnetic shielding layer has a desirable shielding performance for the external magnetic field.

Figure 10:
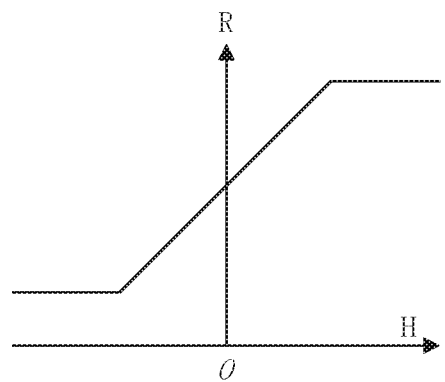
FIG. 10 is a magnetoresistance-external magnetic field characteristic diagram of a magnetoresistive sensor according to the present invention.

FIG. 10 shows a resistance-magnetic field characteristic curve of magnetic tunnel junctions of full bridge arms R1, R2, R3 and R4 and balancing arms R5 and/or R6 forming a balanced magnetoresistive sensor bridge. In working regions of a first signal magnetic field and a second signal magnetic field generated respectively by the first spiral coil and the second spiral coil, resistances of the magnetic tunnel junctions in the first sub region 41 and the second sub region 42 are respectively linear to the first signal magnetic field; and resistances of the magnetic tunnel junctions in the third sub region 43 are linear to the second signal magnetic field.

Figure 11:
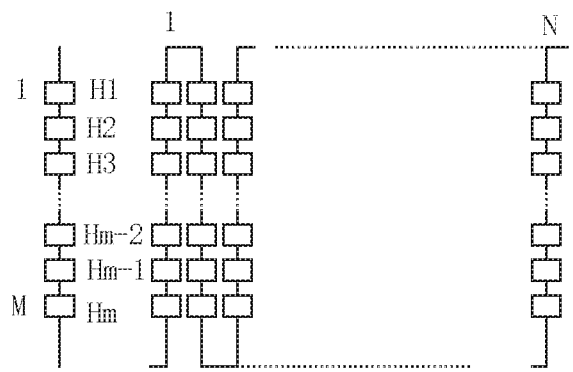
FIG. 11 is a series connection diagram of magnetic tunnel junctions of a magnetoresistive full bridge arm or balancing arm according to the present invention.
Figure 12:
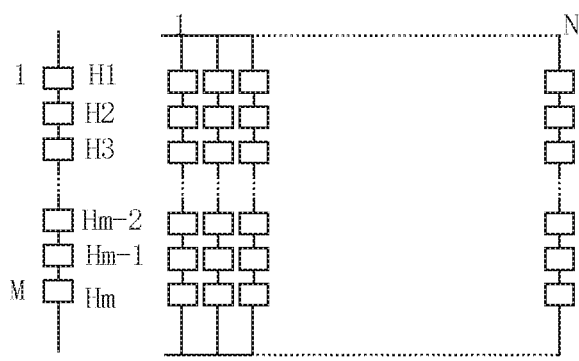
FIG. 12 is a parallel connection diagram of magnetic tunnel junctions of a magnetoresistive full bridge arm or balancing arm according to the present invention.
Figure 13:
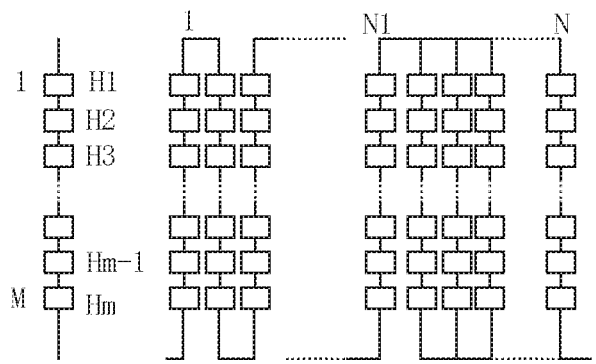
FIG. 13 is a series/parallel connection diagram of magnetic tunnel junctions of a magnetoresistive full bridge arm or balancing arm according to the present invention.

FIG. 11 to FIG. 13 are structural diagrams of the full bridge arms R1, R2, R3, R4 and balancing arms R5 and/or R6 of the balanced magnetoresistive sensor bridge. Each magnetoresistive bridge arm includes M*N arrayed magnetic tunnel junctions. The magnetic tunnel junctions in each column are connected in series to form a magnetic tunnel junction cell string, and the magnetic tunnel junction cell strings are connected in series, in parallel, or in a series/parallel manner to form a two-port structure. N denotes a column of the arrayed structure, M denotes a row of the arrayed structure, and N and M are respectively positive integers greater than or equal to 1. The series connection of the magnetic tunnel junction cell strings is shown in FIG. 11, the parallel connection is shown in FIG. 12, or the series/parallel connection structure is shown in FIG. 13.

Assuming that the frequency of a first signal generated by the current I flowing through the first spiral coil is f1, the frequency of a corresponding magnetic field signal H generated in the first spiral coil is also f1, and assuming that the frequency of a second signal generated by the current I1 flowing through the second spiral coil is f2, the frequency of a corresponding magnetic field signal H1 generated in the second spiral coil is also 2. The corresponding magnetoresistive bridge arms R1 and R2 in the first sub region and the corresponding magnetoresistive bridge arms R3 and R4 in the second sub region have antisymmetric magnetic field distribution characteristics, R1 and R2 have the same magnetic field distribution characteristic, and R3 and R4 have the same magnetic field distribution characteristic. Therefore, it is only necessary to analyze resistance changes in one of the magnetoresistive bridge arms under the effect of the magnetic field. Likewise, the third sub regions R5 and/or R6 have the same magnetic field distribution characteristic, and it is also possible to only analyze one of the balancing arms.

Assuming that the slope of the resistance-magnetic field curve of the magnetic tunnel junction shown in FIG. 10 is dR/dh, each column of the M*N arrayed magnetic tunnel junctions of the magnetoresistive bridge arm R1 includes M (M is an integer greater than 0) serially connected magnetic tunnel junctions, and a sensitive axial magnetic field of the $[m(0<n \le M)]^{th}$ magnetic tunnel junction at the $[n(0<n \le N)]^{th}$ column is $H_{nm1} \sin(2\pi f_1 t)$, then the amplitude of resistance variation is $dR/dh \cdot H_{nm1} \sin(2\pi f_1 t)$. Because of the antisymmetry of the balanced magnetoresistive sensor bridge, a corresponding unit definitely exists in the magnetoresistive bridge arms R4, and the reverse magnetic field of the corresponding unit is $-H_{nm1} \sin(2\pi f_1 t)$, and the corresponding magnetoresistance variation is $-dR/dh \cdot H_{nm1} \sin(2\pi f_1 t)$. Therefore, the total resistance of the bridge arms R1. R4 of the balanced magnetoresistive sensor bridge is unchanged, and the same is true for the bridge arms R2, R3.

Therefore, the resistance variation of the magnetic tunnel junction cell string connected in series or in parallel is directly proportional to the frequency f1 of the current I1, and it is related to the distribution of the sensitive axial magnetic field Hnm1 where the magnetic tunnel junction cell string is located.

On the other hand, Hnm1 is directly proportional to the current I1 in the first spiral coil, that is, $H_{nm1} = K_{nm1} \cdot I1$, and Knm1 is a characteristic coefficient related to electromagnetic performances and geometric sizes of the first spiral coil and the magnetic shielding layer.

Therefore, the series connection, parallel connection, and series/parallel structure between the tunnel junction cell strings are merely represented by operation of characteristic coefficients Knm1. For the series connection between N columns of tunnel junction cell strings:

$$K_1 = \sum_{n=1}^{N} \sum_{n=1}^{M} K_{nm1}.$$

For the parallel connection between the N columns of tunnel junction cell strings, the characteristic factors are expressed as:

$$K_1 = \frac{1}{\sum_{n=1}^{N} \frac{1}{\sum_{m=1}^{M} K_{nm1}}}.$$

For the series/parallel connection, assuming that there are N1 columns connected in series and (N-N1) columns connected in parallel, K can be expressed as:

$$K_1 = \sum_{n=1}^{N} \sum_{n=1}^{M} K_{nm1} + \frac{1}{\sum_{n=1}^{N-N_1} \frac{1}{\sum_{m=1}^{M} K_{nm1}}}$$

The total resistance variation of four full bridge arms R1, R2, R3 and R4 is:

$$\nabla_1 R = I_1 \frac{dR}{dh} \sin(2\pi f_1 t) K_1$$

Likewise, the total resistance variation of the magnetoresistive sensor consisting of the balancing arms R5 and/or R6 is:

$$\nabla_2 R = I_2 \frac{dR}{dh} \sin(2\pi f_2 t) K_2$$

Assuming that no external magnetic field exists, the total resistance of each bridge arm of the magnetoresistive sensor full bridge is $R_0$, the total resistance of the balancing bridge arm is R01, the voltage at two ends of the magnetoresistive sensor full bridge is VI, and the current flowing through a single arm is:

$$\frac{V_1}{2R_0}.$$

The voltage signal output by the magnetoresistive sensor bridge is:

$$\nabla_3 V = 2\frac{V_1}{2R_0}\nabla_1 R = \frac{V_1}{R_0}I_1\frac{dR}{dh}\sin(2\pi f_1 t)K_1$$

The total voltage Vdd-GND at two ends of the balanced magnetoresistive sensor is unchanged, the sum of the voltages at two ends of the balancing arm and the full bridge is unchanged; therefore, when the voltage variation caused by the second frequency signal in the second spiral coil is:

$$\nabla_2 V = I\nabla_2 R = I_2\frac{dR}{dh}\sin(2\pi f_2 t)K_2\frac{V_1}{R_0}$$

the voltage variation caused at the two ends of the full bridge is also:

$$-\nabla_2 V = -I\nabla_2 R = -I_2\frac{dR}{dh}\sin(2\pi f_2 t)K_2\frac{V_1}{R_0}$$

The caused voltage signal output by the magnetoresistive sensor bridge is:

$$\nabla'_3 V = 2\frac{V1 - \nabla_2 V}{2R_0}\nabla_1 R$$

$$\nabla'_3 V = \frac{V_1}{R_0}I_1\frac{dR}{dh}\sin(2\pi f_1 t)K_1 - I_1 I_2 K_1 K_2 \frac{V_1}{R_0}\left(\frac{dR}{dh}\right)^2 \sin(2\pi f_2 t)\sin(2\pi f_1 t)$$

As can be seen, the frequency of the output signal is the sum of or the difference between the frequency f1 of the first spiral coil current I1 and the frequency f2 of the second spiral coil current I2, and further includes the frequency f1.

Figure 14:
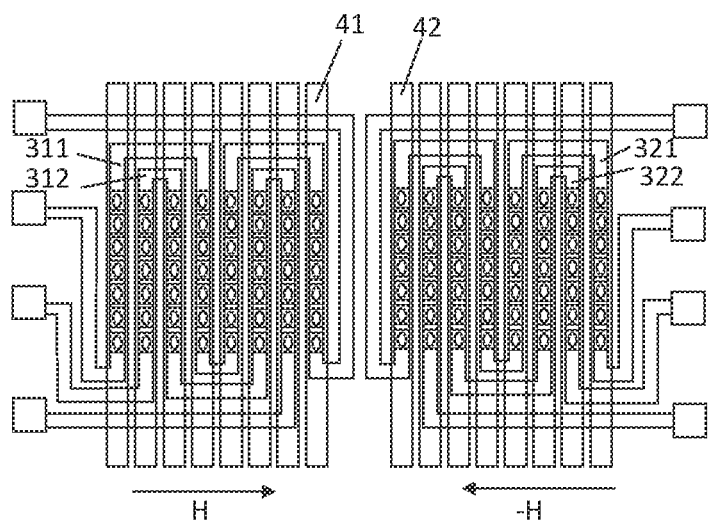
FIG. 14 is a schematic distribution diagram of a first spiral coil and tunnel junctions of a magnetoresistive bridge arm according to the present invention.

FIG. 14 is a diagram showing arrangement of four magnetoresistive bridge arms R1, R2, R3 and R4 in the first sub region 41 and the second sub region 42 of the first spiral coil, respectively corresponding to 311, 312, 321, 322. R1 and R2 are located in the first sub region 41 on the upper surface or lower surface of the first spiral coil 40 in which the current flows in opposite directions. R3 and R4 are located in the second sub region 42 on the upper surface or lower surface of the first spiral coil 40 in which the current flows in opposite directions. The magnetoresistive sensors in the first sub region 41 and the second sub region 42 have antisymmetric geometric characteristics. The magnetic tunnel junctions of the magnetoresistive bridge arms R1, R2, R3, R4 are located at the center of the surface of an electrified section of the spiral coil and are parallel to the current direction of the first spiral coil 40. The tunnel junction units of R1 and R2 are arranged at intervals, and the tunnel junction units of R3 and R4 are arranged at intervals. Sensitive axes of the magnetic tunnel junctions in R1, R2, R3 and R4 are perpendicular to the conductive section of the first spiral coil 40, and the magnetic tunnel junctions are located in a uniform region of the magnetic field.

Figure 15:
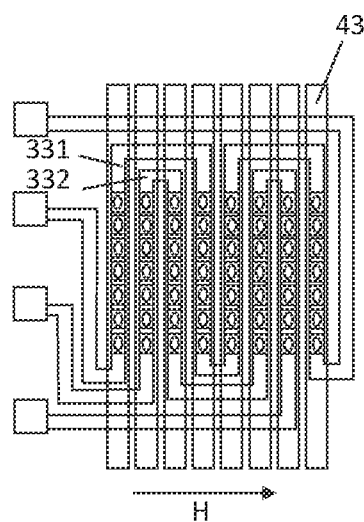
FIG. 15 is a schematic distribution diagram of a second spiral coil and tunnel junctions of a balancing magnetoresistive arm according to the present invention.

Likewise, FIG. 15 is a diagram showing distribution of the balancing arms 331 and 332, i.e., R5 and R6 in the third sub region 43 of the second spiral coil. For easy description, only the situation of including two balancing arms is provided, and a single balancing arm can also be included actually. Likewise, R5 and R6 are respectively located in the third sub region 43 on the upper surface or lower surface of the second spiral coil in which the current flows in one direction. The magnetic tunnel junctions of R5 and R6 are located at the center of the surface of an electrified section of the second spiral coil 44 and are parallel to the current direction. The tunnel junction units of R5 and R6 are arranged at intervals, and sensitive axes of the magnetic tunnel junctions are perpendicular to the conductive section of the spiral coil.

Figure 16:
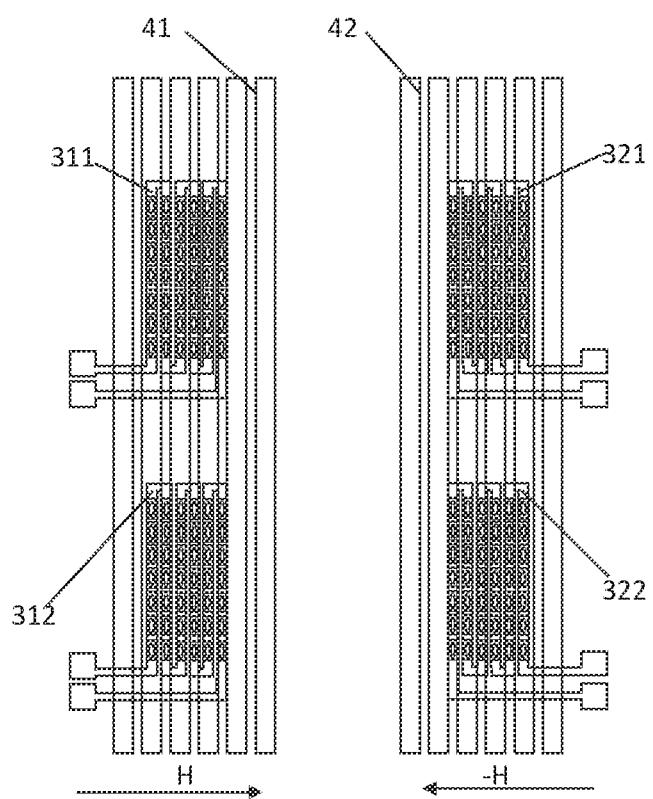
FIG. 16 is another schematic distribution diagram of a first spiral coil and tunnel junctions of a magnetoresistive bridge arm according to the present invention.
Figure 18:
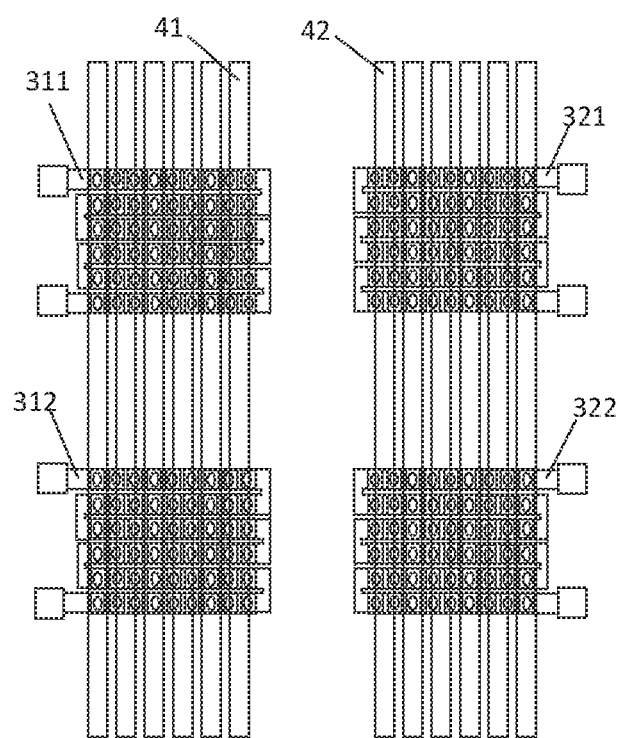
FIG. 18 is still another schematic distribution diagram of a first spiral coil and tunnel junctions of a magnetoresistive bridge arm according to the present invention.

FIG. 16 and FIG. 18 are diagrams showing arrangement of four magnetoresistive bridge arms on the upper surface or lower surface of the first spiral coil. R and R2 are located in the first sub region 41, and R3 and R4 are located in the second sub region 42. Axial magnetic fields of the magnetic tunnel junctions of the bridge arm R1 and axial magnetic fields of the magnetic tunnel junctions of the bridge arm R2 in the first sub region 41 have exactly identical distribution characteristics. Axial magnetic fields of the magnetic tunnel junctions of the bridge arm R3 and axial magnetic fields of the magnetic tunnel junctions of the bridge arm R4 in the second sub region 42 have exactly identical distribution characteristics. R1 and R3 have structurally symmetric characteristics, and R2 and R4 have structurally symmetric characteristics. Sensitive axial magnetic fields of the magnetic tunnel junctions in the first sub region 41 are in a direction opposite to that of sensitive axial magnetic fields of the magnetic tunnel junctions in the second sub region 42. The magnetoresistive bridge arms separately include M*N arrayed magnetic tunnel junctions. The magnetic tunnel junctions in each column are connected in series to form a magnetic tunnel junction cell string. The magnetic tunnel junction cell strings are connected in series, in parallel, or in a series/parallel manner to form a two-port structure. N denotes a column of an arrayed structure, M denotes a row of the arrayed structure, and N and M are respectively positive integers greater than or equal to 1. The magnetic tunnel junctions in the magnetoresistive bridge arms are parallel to the corresponding first spiral coil 40 or perpendicular to the first spiral coil 40. Sensitive axes of the magnetic tunnel junctions of the magnetoresistive bridge arms R1, R2, R3 and R4 are perpendicular to the first spiral coil 40. In this case, the magnetic tunnel junctions can be located in a uniform region of the magnetic field, a non-uniform region of the magnetic field, or partially in the uniform region and partially in the non-uniform region of the magnetic field.

Figure 17:
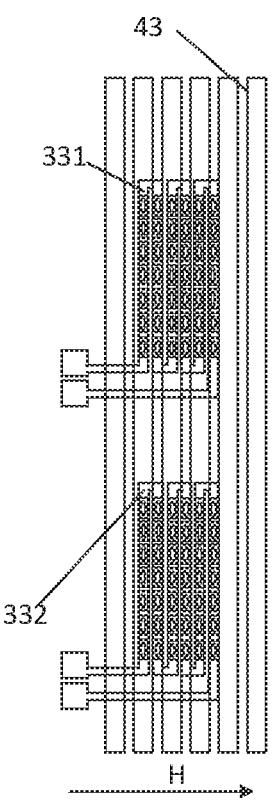
FIG. 17 is another schematic distribution diagram of a second spiral coil and tunnel junctions of a balancing magnetoresistive arm according to the present invention.
Figure 19:
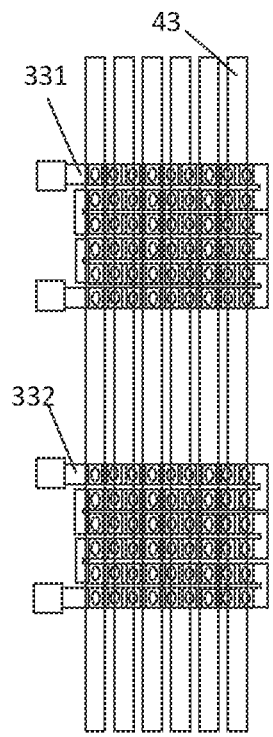
FIG. 19 is still another schematic distribution diagram of a second spiral coil and tunnel junctions of a balancing magnetoresistive arm according to the present invention.

Likewise, FIG. 17 and FIG. 19 are diagrams showing arrangement of two balancing magnetoresistive bridge arms on the upper surface or lower surface of the second spiral coil. The balancing magnetoresistive arms R5 and R6 are respectively located in the third sub region 43. R5 and R6 separately include M*N arrayed magnetic tunnel junctions. The magnetic tunnel junctions in each column are connected in series to form a magnetic tunnel junction cell string. The magnetic tunnel junction cell strings are connected in series, in parallel, or in a series/parallel manner to form a two-port structure. N denotes a column of an arrayed structure, M denotes a row of the arrayed structure, and N and M are respectively positive integers greater than or equal to 1. Axial magnetic fields of the magnetic tunnel junctions of the bridge arm R5 and axial magnetic fields of the magnetic tunnel junctions of the bridge arm R6 have exactly identical distribution characteristic. The magnetic tunnel junctions of the bridge arms R5 and R6 are parallel to the corresponding second spiral coil 44 or perpendicular to the second spiral coil 44. Sensitive axes of the magnetic tunnel junctions of the bridge arms R5 and R6 are perpendicular to the second spiral coil 44. In this case, the magnetic tunnel junctions can be located in a uniform region of the magnetic field, a non-uniform region of the magnetic field, or partially in the uniform region and partially in the non-uniform region of the magnetic field.

The first signal f1 is connected to the first spiral coil 40 actively or passively, the second signal f2 is connected to the second spiral coil 44 passively or actively, and the frequency-mixed signal is output by the signal output end of the balanced magnetoresistive sensor bridge passively or actively.

Figure 20:
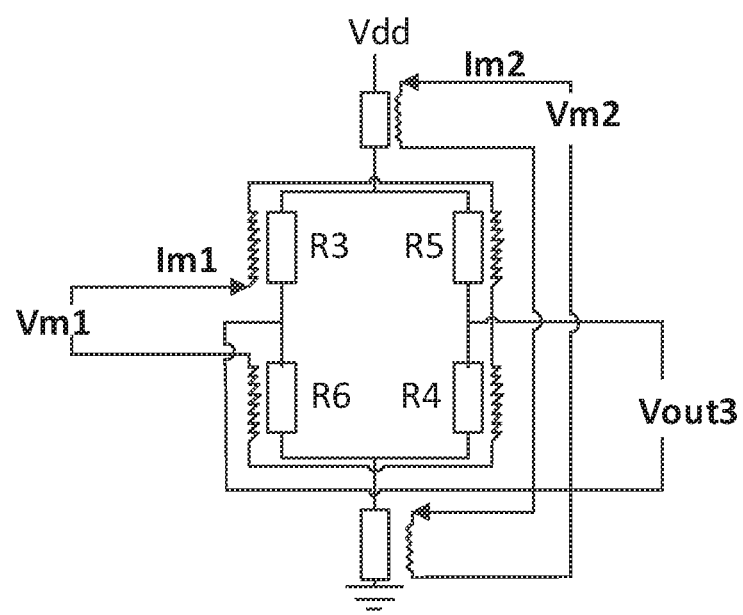
FIG. 20 is a first working mode diagram of a balanced magnetoresistive frequency mixer according to the present invention.

FIG. 20 is a circuit diagram of signal processing of a magnetoresistive frequency mixer. The first signal f1 is directly connected to two ends of the first spiral coil passively, the second signal f2 is directly connected to two ends of the second spiral coil passively, and the frequency of the frequency-mixed signal is directly output through the signal output end passively.

Figure 21:
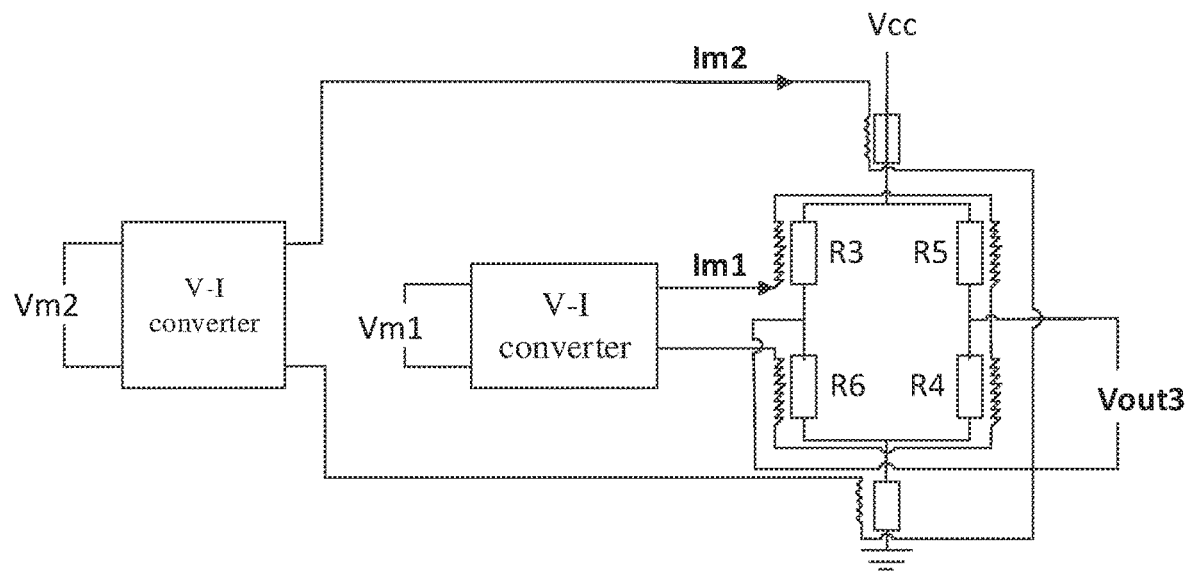
FIG. 21 is a second working mode diagram of a balanced magnetoresistive frequency mixer according to the present invention.

FIG. 21 is another circuit diagram of signal processing of a magnetoresistive frequency mixer. The first signal f1 is connected to two ends of the first spiral coil actively by converting a voltage signal into a current signal with a V-I converter. The second signal f2 is connected to two ends of the second spiral coil actively by converting a voltage signal into a current signal with a V-I converter. The frequency-mixed signal is output passively.

Figure 22:
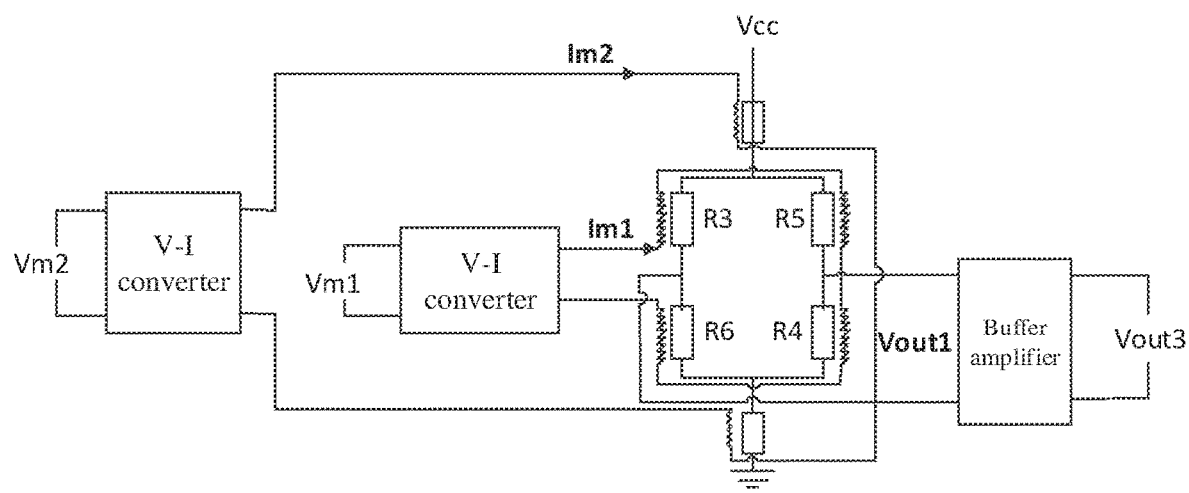
FIG. 22 is a third working mode diagram of a balanced magnetoresistive frequency mixer according to the present invention.

FIG. 22 is a third circuit diagram of signal processing of a magnetoresistive frequency mixer. The first signal f1 is connected to two ends of the first spiral coil actively by converting a voltage signal into a current signal with a V-I converter. The second signal f2 is connected to two ends of the second spiral coil actively by converting a voltage signal into a current signal with a V-I converter. The frequency-mixed signal is actively output indirectly through a buffer voltage amplifier.

Figure 23:
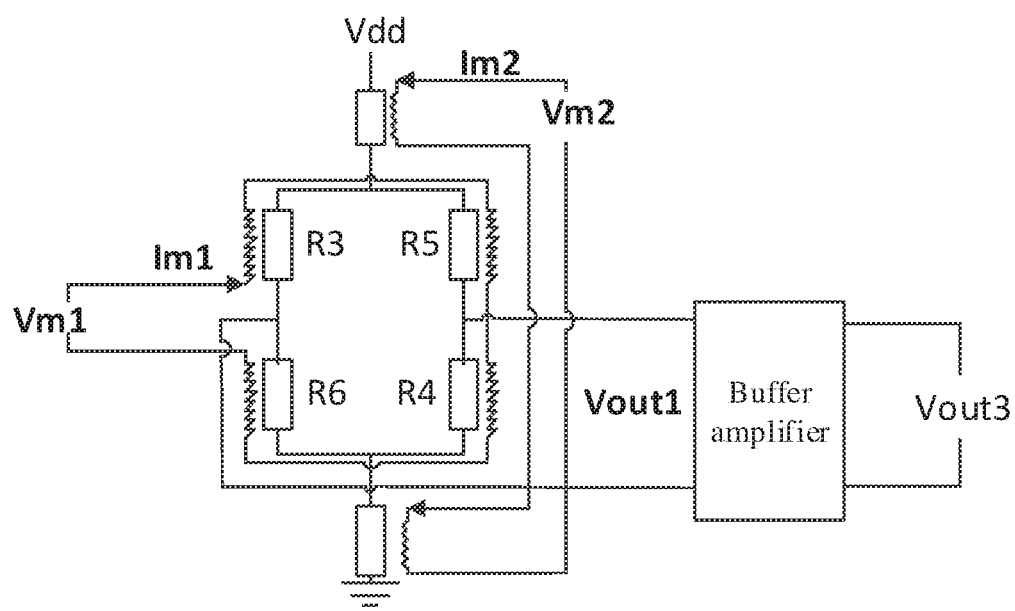
FIG. 23 is a fourth working mode diagram of a balanced magnetoresistive frequency mixer according to the present invention.

FIG. 23 is a fourth circuit diagram of signal processing of a balanced magnetoresistive frequency mixer. The first signal f1 is connected to two ends of the first spiral coil passively, the second signal f2 is connected to two ends of the second spiral coil passively, and the frequency-mixed signal is actively output indirectly through a buffer voltage amplifier.

The above descriptions are merely preferred embodiments of the present invention and are not intended to limit the present invention. For those skilled in the art, the present invention can have various modifications and variations. Any modification, equivalent replacement, improvement, and the like within the spirit and principle of the present invention shall all fall within the protection scope of the present invention.

The invention claimed is:

1. A balanced magnetoresistive frequency mixer, comprising:
a spiral coil;
a balanced magnetoresistive sensor bridge; and
a magnetic shielding layer,
wherein the spiral coil is located between the magnetic shielding layer and the balanced magnetoresistive sensor bridge,
wherein the spiral coil comprises a first spiral coil and a second spiral coil, an upper surface or a lower surface of the first spiral coil has a first sub region and a second sub region in which the current flows in opposite directions, and an upper surface or a lower surface of the second spiral coil has a third sub region in which the current flows in one direction,
wherein the balanced magnetoresistive sensor bridge comprises a magnetoresistive full bridge and a balancing magnetoresistive arm connected to the magnetoresistive full bridge, the magnetoresistive full bridge consists of four magnetoresistive bridge arms, two of which are located in the first sub region and the other two are located in the second sub region, and the balancing magnetoresistive arm is located in the third sub region,
wherein a first frequency signal is input into the first spiral coil (40), a second frequency signal is input into the second spiral coil, and a frequency-mixed signal is output from a signal output end of the magnetoresistive full bridge, wherein the output frequency of the frequency-mixed signal is a sum of or a difference between the frequencies of the first frequency signal and the second frequency signal.

2. The balanced magnetoresistive frequency mixer according to claim 1, wherein
there is one balancing magnetoresistive arm that is connected to a power supply output end or an input end of the magnetoresistive full bridge; or
there are two balancing magnetoresistive arms that are connected to a power supply output end and an input end of the magnetoresistive full bridge, respectively.

3. The balanced magnetoresistive frequency mixer according to claim 2, wherein the magnetoresistive bridge arms and the balancing magnetoresistive arm separately comprise M*N arrayed magnetic tunnel junctions, the magnetic tunnel junctions in each column are connected in series to form a magnetic tunnel junction cell string, the magnetic tunnel junction cell strings are connected in series, in parallel, or in a series/parallel manner to form a two-port structure, N denotes a column of an arrayed structure, M denotes a row of the arrayed structure, and N and M are respectively positive integers greater than or equal to 1.

4. The balanced magnetoresistive frequency mixer according to claim 3, wherein sensitive axes of the magnetic tunnel junctions in the magnetoresistive bridge arms are all perpendicular to a current direction of the first spiral coi, sensitive axes of the magnetic tunnel junctions in the balancing magnetoresistive arm are all perpendicular to a current direction of the second spiral coil, and distribution characteristics of sensitive axial magnetic fields of the magnetic tunnel junctions in the first sub region are opposite to those of the magnetic tunnel junctions in the second sub region.

5. The balanced magnetoresistive frequency mixer according to claim 3, wherein the magnetic tunnel junctions in the first sub region and the magnetic tunnel junctions in the second sub region are connected in identical structures and arranged symmetrically.

6. The balanced magnetoresistive frequency mixer according to claim 3, wherein
resistances of the magnetic tunnel junctions in the first sub region and the second sub region are respectively linear to sensitive axial magnetic fields of the magnetic tunnel junctions generated by the first spiral coil; and
resistances of the magnetic tunnel junctions in the third sub region are linear to sensitive axial magnetic fields of the magnetic tunnel junctions generated by the second spiral coil.

7. The balanced magnetoresistive frequency mixer according to claim 3, wherein the magnetic tunnel junctions in the first sub region and the second sub region are perpendicular or parallel to the current direction of the first spiral coil, and the magnetic tunnel junctions in the third sub region are perpendicular or parallel to the current direction of the second spiral coil.

8. The balanced magnetoresistive frequency mixer according to claim 1, wherein the first frequency signal is connected to the first spiral coil actively or passively, the second frequency signal is connected to the second spiral coil passively or actively, and the frequency-mixed signal is connected to the signal output end of the balanced magnetoresistive sensor bridge passively or actively.

9. The balanced magnetoresistive frequency mixer according to claim 1, wherein the spiral coil is a coil of a high-conductivity metal material comprising one or more of copper, gold, silver, aluminum, and tantalum, and the magnetic shielding layer is a layer of a high-permeability ferromagnetic alloy comprising one or more of NiFe, CoFeSiB, CoZrNb, CoFeB, FeSiB, and FeSiBNbCu.

10. The balanced magnetoresistive frequency mixer according to claim 1, wherein the thickness of the spiral coil is 1-20 μm, the width of the spiral coil is 5-40 μm, a spacing between two adjacent spiral coils is 10-100 μm, and the thickness of the magnetic shielding layer is 1-20 μm.

* * * * *

UNITED STATES PATENT AND TRADEMARK OFFICE
CERTIFICATE OF CORRECTION

PATENT NO. : 10,873,294 B2  
APPLICATION NO. : 16/326342  
DATED : December 22, 2020  
INVENTOR(S) : Deak et al.

Page 1 of 1

It is certified that error appears in the above-identified patent and that said Letters Patent is hereby corrected as shown below:

In the Claims

In Column 12, Line 45, in Claim 4, delete "coi," and insert --coil,-- therefor

Signed and Sealed this
Twenty-third Day of March, 2021

Drew Hirshfeld
*Performing the Functions and Duties of the*
*Under Secretary of Commerce for Intellectual Property and*
*Director of the United States Patent and Trademark Office*